US 6,569,757 B1

United States Patent
Weling et al.

(10) Patent No.: US 6,569,757 B1
(45) Date of Patent: May 27, 2003

(54) METHODS FOR FORMING CO-AXIAL INTERCONNECT LINES IN A CMOS PROCESS FOR HIGH SPEED APPLICATIONS

(75) Inventors: Milind Weling, San Jose; Subhas Bothra, Fremont; Calvin Todd Gabriel, Cupertino; Michael Misheloff, Dublin, all of CA (US)

(73) Assignee: Philips Electronics North America Corporation, New York, NY (US)

( * ) Notice: Subject to any disclaimer, the term of this patent is extended or adjusted under 35 U.S.C. 154(b) by 0 days.

(21) Appl. No.: 09/429,540

(22) Filed: Oct. 28, 1999

(51) Int. Cl.[7] .......................................... H01L 21/4763
(52) U.S. Cl. ........................ 438/618; 438/622; 438/667; 438/668; 257/662; 257/663; 257/664; 330/286; 357/71; 29/828
(58) Field of Search ................................ 438/618, 622, 438/667, 668; 156/643; 357/71; 257/664, 662, 663; 330/286; 29/828

(56) References Cited

U.S. PATENT DOCUMENTS

| | | | |
|---|---|---|---|
| 5,000,818 A | * 3/1991 | Thomas et al. ............. 156/643 |
| 5,117,276 A | * 5/1992 | Thomas et al. ............. 357/71 |
| 5,357,138 A | * 10/1994 | Kobayashi .................. 257/664 |
| 5,363,550 A | 11/1994 | Aitken et al. | |
| 5,652,557 A | 7/1997 | Ishikawa | |
| 5,665,644 A | 9/1997 | Sandhu et al. | |
| 5,729,047 A | 3/1998 | Ma | |
| 5,811,882 A | * 9/1998 | Latham, IV et al. ........ 257/776 |
| 6,060,383 A | * 5/2000 | Nogami et al. ............. 438/622 |
| 6,143,616 A | * 11/2000 | Geusic et al. ............... 438/389 |
| 6,281,587 B1 | * 8/2001 | Nigami et al. .............. 257/758 |

FOREIGN PATENT DOCUMENTS

| | | |
|---|---|---|
| GB | 2 277 832 | 11/1994 |
| JP | 61096781 | 5/1986 |
| JP | 61096782 | 5/1986 |
| JP | 01290238 | 11/1989 |

OTHER PUBLICATIONS

Thomas, M. E. et al., VLSI multilevel micro–coaxial interconnects for high speed devices, IEDM Digest 1990, Dec. 1990, pp55–58.*

* cited by examiner

Primary Examiner—Caridad Everhart
Assistant Examiner—Belur Keshavan
(74) Attorney, Agent, or Firm—Martine & Penilla, LLP (57) ABSTRACT

A method of forming a co-axial interconnect line in a dielectric layer is provided. The method includes defining a trench in the dielectric layer and then forming a shield metallization layer within the trench. After forming the shield metallization layer, a conformal oxide layer is deposited within the shield metallization layer. A center conductor is then formed within the conformal oxide layer. Once the center conductor is formed, a fill oxide layer is deposited over the center conductor. A cap metallization layer is then formed over the fill oxide layer and is in contact with the shield metallization layer.

18 Claims, 10 Drawing Sheets

METHODS FOR FORMING CO-AXIAL INTERCONNECT LINES IN A CMOS PROCESS FOR HIGH SPEED APPLICATIONS

CROSS REFERENCE TO RELATED APPLICATIONS

This application is related to the following U.S. patent application entitled "Methods for Implementing Co-Axial Interconnect Lines in a CMOS Process for High Speed RF and Microwave Applications" having U.S. patent application Ser. No. 09/429,586, filed on the same day as the instant application. This application is hereby incorporated by reference.

BACKGROUND OF THE INVENTION

1. Field of the Invention

The present invention relates to the manufacture of semiconductor devices. More particularly, the present invention relates to the integration of radio frequency (RF) features, RF devices, microwave features, and microwave devices into standard complementary metal oxide semiconductor (CMOS) chips.

2. Description of the Related Art

Today's semiconductor devices are continually being pushed to meet stricter demands. As devices using this technology inundate the marketplace, consumers place higher demands on the devices. These demands includes smaller, more compact devices with greater functionality.

In order to meet the demands, semiconductor devices employ CMOS chips and RF chips. Such devices include, for example, cellular phones that require both digital CMOS circuitry as well as RF circuitry to enable wireless communication. Conventionally, in order to integrate both digital CMOS and RF circuitry onto one chip, manufacturers have been forced to use co-axial interconnect lines to handle the RF signals.

However, current high speed technology using CMOS circuitry suffers large losses of power. Today's devices are expected to handle high speed applications such as RF and microwave applications. In the near future, standard digital CMOS interconnects will be expected to run at frequencies up to and greater than 1 GHz.

Figure 1A:
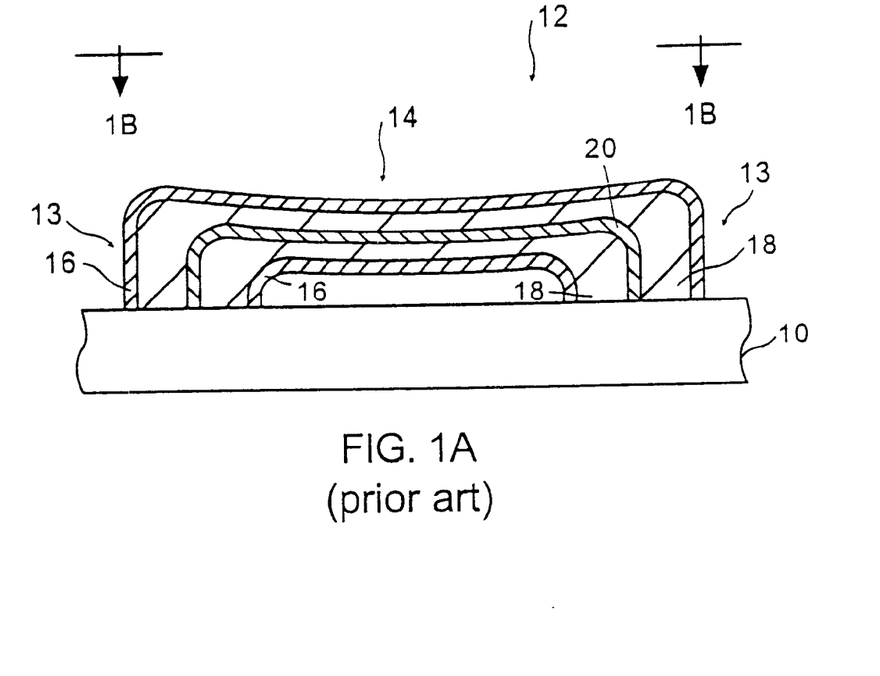
FIG. 1A depicts a cross-sectional view of a prior art interconnect structure.
Figure 1B:
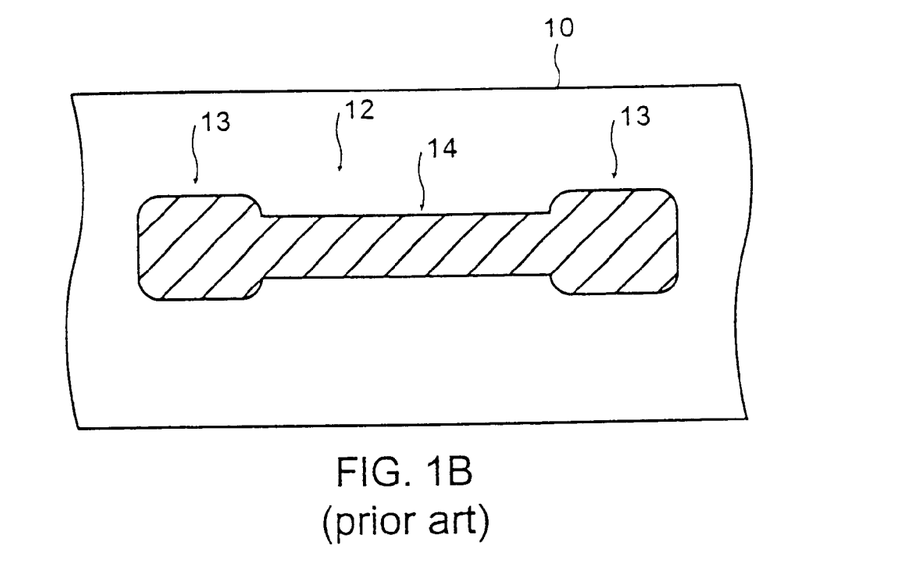
FIG. 1B represents a top view of the prior art interconnect structure.

In addition, the use of a co-axial interconnect line presents other problems. FIGS. 1A and 1B represent a cross-sectional view and a top view, respectively, of a prior art interconnect structure 12 having a suspended portion 14 over a silicon substrate 10. Interconnect structure 12 includes an inner conductor 20, an insulating dielectric coating 18 and an outer conductive layer that serves to encapsulate the insulating dielectric coating 18. Interconnect structure 12 also includes two contact posts 13 fabricated that have a larger dimension so as to support suspended portion 14.

It should be noted that the suspended portion 14 tends to sag under the influence of gravity. Therefore, there is a limit to the length of such structures before they fracture and break, which is a significant practical problem in implementing this prior art structure. Another problem encountered with the interconnect structure of FIG. 1A is the inability to stack multiple interconnect layers. By way of example, if a second interconnect structure were built over structure 12, the probability of breaking center region 14 dramatically increases due to the lack of mechanical support under center region 14. For a more detailed description of the steps associated with fabricating this prior art interconnect structure, reference may be made to a paper entitled "VLSI Multilevel Micro-Coaxial Interconnects for High Speed Devices" by M. E. Thomas, et al., Fairchild Research Center, National Semiconductor Corporation, Santa Clara, Calif., IEDM Tech. Dig., pages 55–58 (1990), which is hereby incorporated by reference.

Another drawback of integrating RF circuitry into chips that are primarily designed for digital CMOS circuits is co-axial lines 12 must be integrated at the top-most metallization level of a chip. This presents significant limitations in the number of RF lines that can be used to complete RF signal processing for a given chip. Therefore, designers wanting to integrate RF lines over predominately CMOS chips must design the chip substantially larger to enable the desired number of RF lines to appropriately be integrated to the top metal layer of the chip. This limitation is well known to circuit designers, and therefore, it is often determined to be more advantageous to use separate chips for CMOS circuitry and RF circuitry.

Figure 1C:
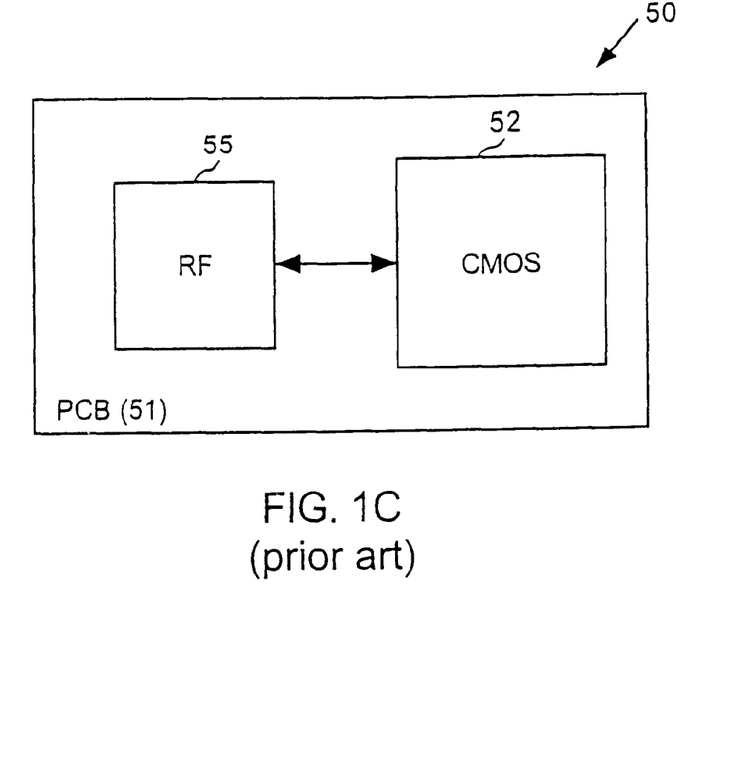
FIG. 1C is a top view of a prior art implementation using a separate RF chip and CMOS chip.

As shown in FIG. 1C, designers of cellular phones typically find it more practical to use a CMOS chip 52 for performing digital signal processing and a separate RF circuit 55 to process RF signals. This is commonly preferred due to the limitations of trying to integrate RF lines onto chips that are custom fabricated for CMOS digital processing. Nonetheless, an arrangement of this sort presents problems, among them fabrication costs, power losses, signal losses and additional packaging complexities. Circuit 50 requires that RF circuit 55 and the CMOS chip 52 be individually fabricated and integrated onto the printed circuit board (PCB) 51. This increases manufacturing costs and manufacturing time.

Microwave and RF applications operate at high frequencies. The high frequencies require the use of co-axial lines or waveguides. When these lines are integrated with standard CMOS lines, a large loss of power occurs. In order to compensate for these losses, amplification circuitry may be necessary.

As signals are communicated back and forth from RF circuit 55 and CMOS chip 52, signal loss will naturally occur. Henceforth, this signal loss reduces overall efficiency of a circuit implementation needing both digital CMOS and RF circuitry. In order to overcome these losses, signal conditioning may be necessary to improve signal integrity. However, the use of such devices will aggravate the problem of packaging that already exists with the prior art.

Packaging inefficiencies of the prior art circuit using RF circuit 55 and CMOS chip 52 make this type of circuit undesirable. In order to integrate separate RF circuit 55 along with CMOS chip 52, greater amounts of space on the PCB will be required, thereby forcing portable electronics (e.g., cellular phones) to be packaged in larger housings.

In view of the foregoing, there is a need for a circuit which integrates an RF circuit with a CMOS chip which avoids the problems of the prior art. This new circuit should be easy to manufacture, maintain power and signal strength, avoid the use of prior art co-axial lines and come in a more space efficient package. Additionally, this circuit should be able to handle high speed applications, including RF and microwave applications.

SUMMARY OF THE INVENTION

Broadly speaking, the present invention fills these needs by providing an integrated circuit device which can integrate both standard CMOS circuitry and co-axial lines that are capable of handling RF signals, microwave signals and other high speed signals, and methods for making such a device. It should be appreciated that the present invention can be implemented in numerous ways, including as a process, an apparatus, a system, a device or a method. Several inventive embodiments of the present invention are described below.

In one embodiment, a method of forming a co-axial interconnect line in a dielectric layer is disclosed. The method includes defining a trench in the dielectric layer and then forming a shield metallization layer within the trench. After forming the shield metallization layer, a conformal oxide layer is deposited within the shield metallization layer. A center conductor is then formed within the conformal oxide layer. Once the center conductor is formed, a fill oxide layer is deposited over the center conductor. A cap metallization layer is then formed over the fill oxide layer and is in contact with the shield metallization layer.

In another embodiment, a semiconductor device incorporating a co-axial interconnect line is disclosed. The semiconductor device includes a dielectric layer and a trench defined within the dielectric layer. A shield metallization layer is defined over the dielectric layer and along the trench. The semiconductor device also includes a center conductor contained within the shield metallization layer. An oxide layer surrounds the center conductor. In addition, a cap metallization layer is defined over the oxide layer and over the shield metallization layer, such that the cap metallization layer is in electrical contact with the shield metallization layer. The cap metallization layer and the shield metallization layer form an outer shield of a co-axial line and the center conductor forms the inner conductor of the co-axial line.

In yet another embodiment, a method for making a semiconductor device with co-axial interconnect lines in a CMOS chip for high speed applications is disclosed. The method includes forming a trench in a base dielectric layer and forming a shield metallization layer over the base dielectric layer and the trench. After the shield metallization layer is formed, a conformal oxide layer is deposited over the shield metallization layer such that the conformal oxide layer defines a region within the trench. Once the conformal oxide layer is deposited, a liner metallization layer is formed over the conformal oxide layer and over the region within the trench. Next, a conductive layer is disposed within the liner metallization layer to fill the region within the trench with conductive material. After the conductive layer is disposed within the liner metallization layer, the conductive layer is etched along with the liner layer to define an inner conductor within the region that is defined within the trench. Next, an oxide layer is formed over the inner conductor that is defined by the liner layer and the conductive layer, whereby the oxide layer is configured to fill the region within the trench. The oxide layer and the conformal oxide layer are then planarized down to the shield metallization layer. A cap metallization layer is then formed over the shield metallization layer, the conformal oxide layer, and the oxide layer defined within the trench.

The many advantages of the present invention should be recognized. A semiconductor application can now integrate co-axial features and standard CMOS features on a single chip, and the co-axial features can be integrated on any level of a chip's interconnect region. As such, designers are no longer required to design and fabricate separate chips having co-axial lines and CMOS chips to make a desired integrated circuit application.

As a further advantage, there is no power and signal losses due to separate chip integration, increased fabrication time and costs, and the need for larger silicon area to design simple or complex circuits. Also, the present invention has the ability to handle high speed applications, such as RF, microwave applications and other applications operating at frequencies up to and greater than 1 GHz. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. Therefore, like reference numerals designate like structural elements.

DETAILED DESCRIPTION OF THE PREFERRED EMBODIMENTS

A semiconductor device with an integrated co-axial interconnect line in a dielectric layer is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 2:
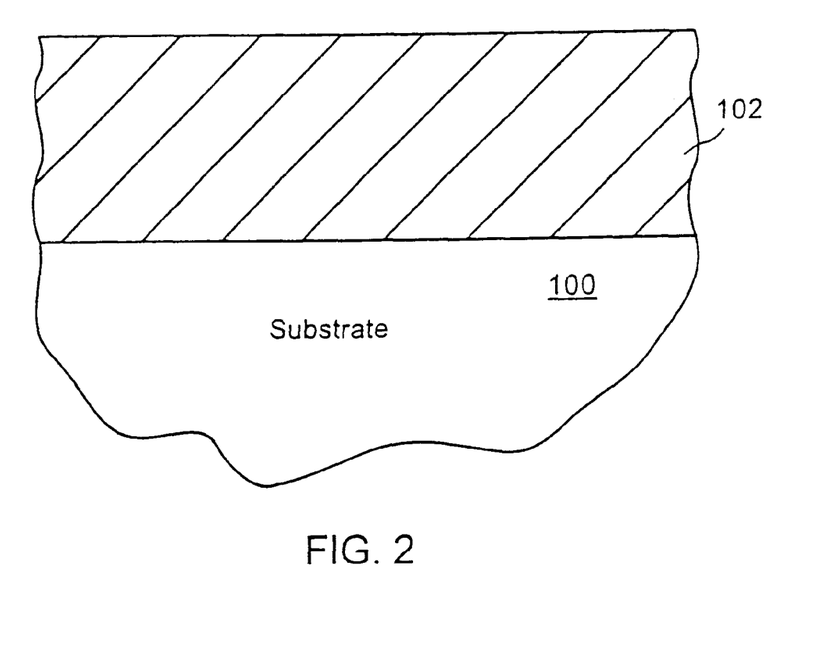
FIG. 2 is a cross-sectional view of a semiconductor substrate with a dielectric layer placed above the semiconductor substrate.

FIGS. 1A–1C were described with reference to the prior art. In FIG. 2, a cross-sectional view of a semiconductor substrate 100 is shown. A dielectric layer 102 is formed over the substrate 100, which typically has active transistor devices (not shown). In this embodiment, the dielectric layer 102 is placed through a chemical mechanical polishing operation (CMP) in order to planarize a top surface of dielectric layer 102.

Figure 3:
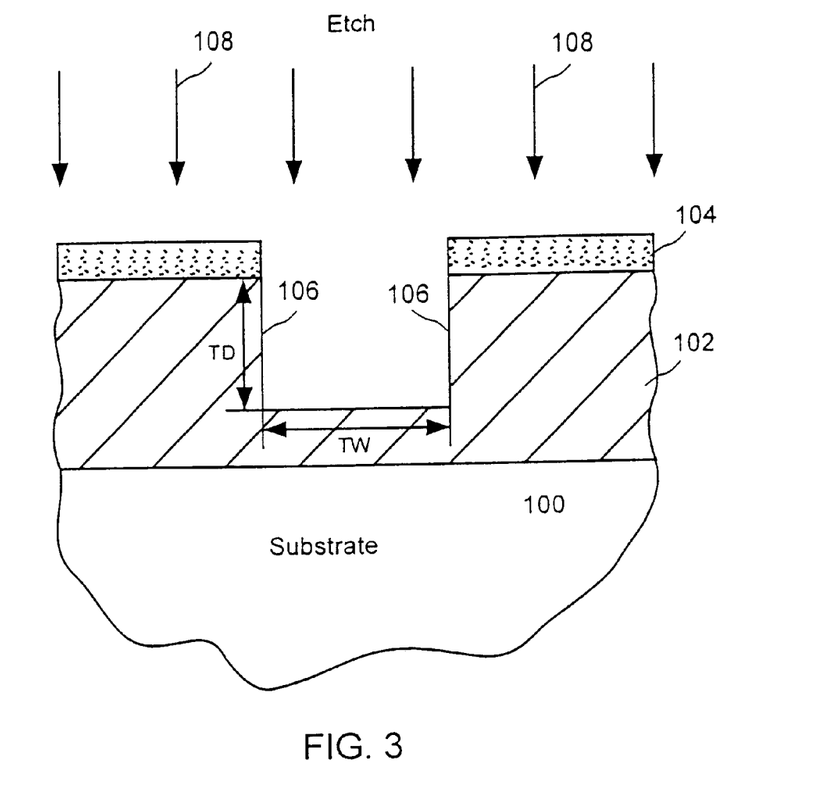
FIG. 3 illustrates the formation of a trench which is used to form a co-axial interconnect line in accordance with one embodiment of the present invention.

FIG. 3 illustrates the formation of a trench 106, which will be used to form a co-axial interconnect line, in accordance with one embodiment of the present invention. A photoresist mask 104 is shown patterned over dielectric layer 102 which defines a region where the trench 106 is desired. A dielectric etch operation 108 is then performed to form the trench 106. As shown, the trench 106 is defined by a trench depth (TD) and a trench width (TW). Preferably, the TW ranges from about 0.5 micron to about 100 microns, more preferably from about 1 micron to about 10 microns, and most preferably 1 micron. The depth of the TD is preferably between about 5,000 Angstroms and about 10,000 Angstroms, and more preferably about 7,000 Angstroms. In situations where wider trenches are desired, an additional mask should be used to protect the trench filled tungsten during the tungsten etchback operation.

Figure 4:
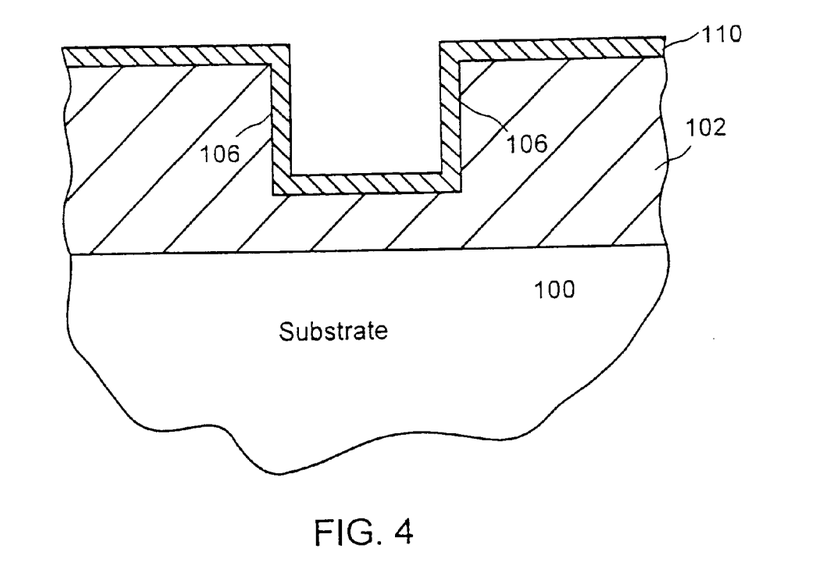
FIG. 4 shows the deposition of a shield metallization layer in accordance with one embodiment of the present invention.

FIG. 4 shows a deposited shield metallization layer 110, in accordance with one embodiment of the present invention. The shield metallization layer 110 is preferably formed by depositing a layer of titanium nitride on the surface of dielectric layer 102 and along the walls of trench 106 as shown. In addition to being titanium nitride (TiN), the shield metallization layer 110 may also be any other suitable conductive material, such as titanium (Ti) or a combination of titanium and tungsten (Ti:W). The shield metallization layer 110 is preferably between about 100 Angstroms and about 1,000 Angstroms, and more preferably between about 200 Angstroms and about 500 Angstroms, and most preferably about 300 Angstroms. The shield metallization layer 110 will be used to define a outer shield of a co-axial line. The co-axial line can be used to transmit RF signals, microwave-type signals, and other high speed signals within a CMOS design.

Figure 5:
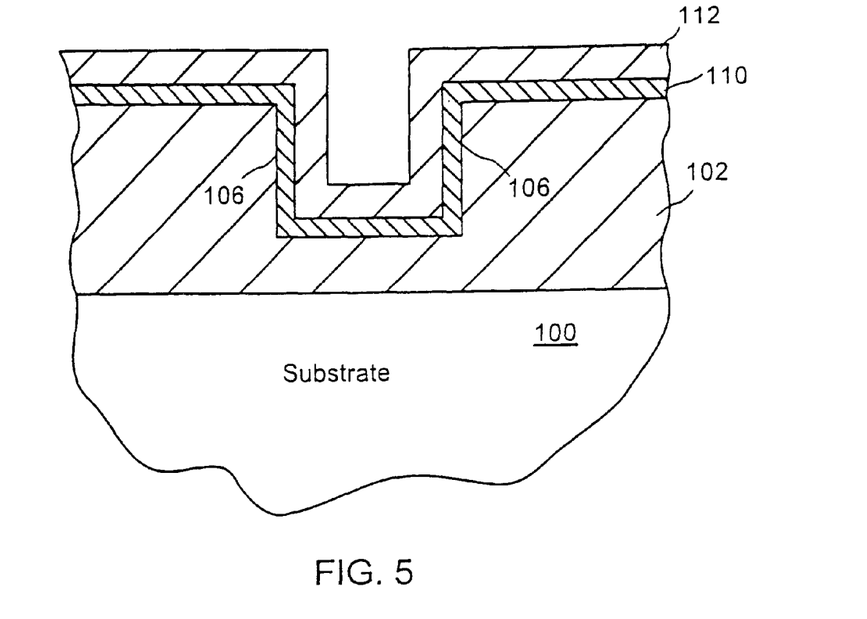
FIG. 5 illustrates the deposition of a conformal oxide layer.

FIG. 5 illustrates the deposition of a conformal oxide layer 112. The conformal oxide layer 112 is deposited over the shield metallization layer 110 and along the walls of the trench 106 using a plasma enhanced chemical vapor deposition (PECVD) technique. The conformal oxide layer 112 preferably has a thickness in the range of about 300 Angstroms to about 5,000 Angstroms and more preferably about 1,000 Angstroms. In this embodiment, it is desired that the conformal nature of the PECVD or other suitable deposition technique leave a region within the trench 106. This region will then be used to define a center conductor, as will be described in greater detail with reference to FIG. 7.

Figure 6:
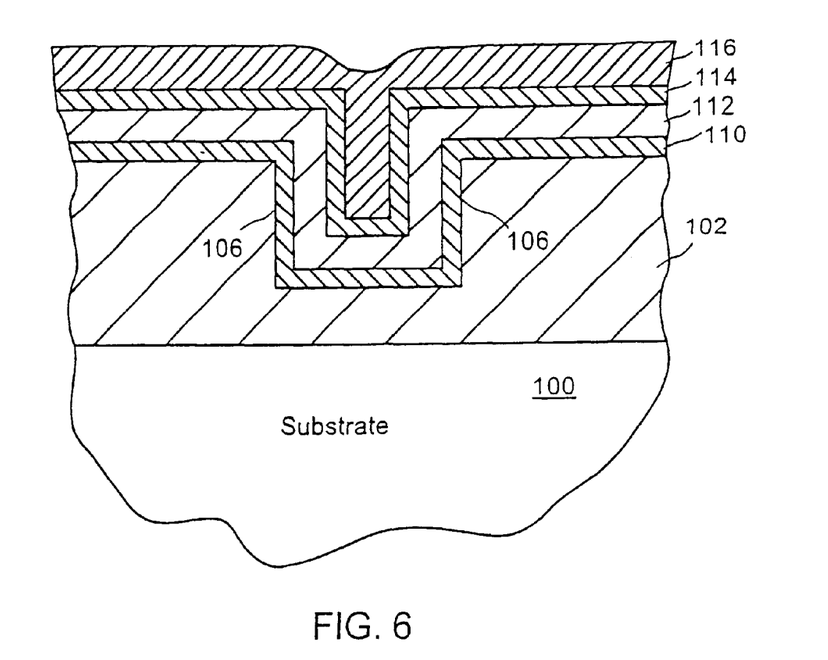
FIG. 6 demonstrates the deposition of a liner metallization layer and the deposition of a tungsten metallization layer.

FIG. 6 demonstrates the deposition of a liner metallization layer 114 and a tungsten metallization layer 116. The liner metallization layer 114 is deposited over the conformal oxide layer 112 and along the walls of the trench 106 as shown. The liner metallization layer 114 is preferably deposited to a thickness ranging from about 100 Angstroms to about 500 Angstroms, and more preferably about 200 Angstroms. The liner metallization layer 114 is also preferably titanium nitride (TiN). However, other suitable conductive materials, such as titanium tungsten (TiW), tungsten (W) and tantalum (Ta) can also be used. The tungsten metallization layer 116 is subsequently deposited over the liner metallization layer 114, thus filling the trench 106. The tungsten metallization layer 116 is preferably deposited to a thickness of about 3,000 Angstroms to about 10,000 Angstroms, and more preferably to about 6,000 Angstroms. In general, the thickness of the deposited tungsten should be selected such that the region within the trench is substantially filled. In this embodiment, the tungsten metallization layer 116 is preferably tungsten, however, other suitable conductive materials may also be used, such as aluminum (Al) and copper (Cu).

Figure 7:
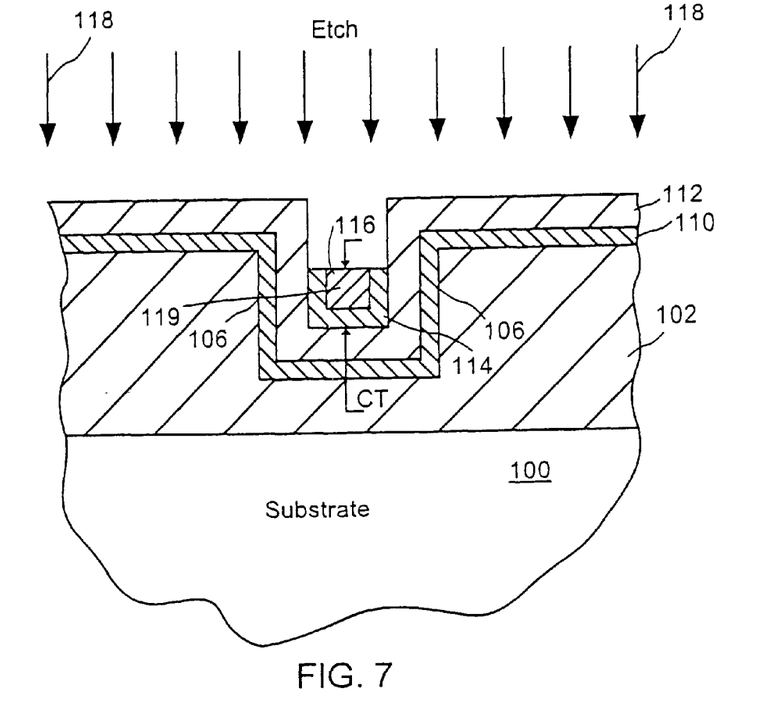
FIG. 7 depicts the formation of a center conductor in accordance with one embodiment of the present invention.

FIG. 7 depicts the formation of a center conductor 119 in accordance with one embodiment of the present invention. The center conductor 119 is preferably defined using a metallization etch operation 118. The metallization etch operation 118 removes the tungsten metallization layer 116 and the liner metallization layer 114 to a desired depth. Once the etch operation 118 is complete, the remaining tungsten metallization layer 116 and the liner metallization layer 114 define a core thickness (CT). The CT is configured to define a center conductor 119 of the co-axial line. The thickness of the CT is preferably between about 2,000 Angstroms and about 7,000 Angstroms, and more preferably is about 4,000 Angstroms. In addition, as can be seen in FIG. 7, the shield metallization layer 110 defines part of the outer shield.

Figure 8:
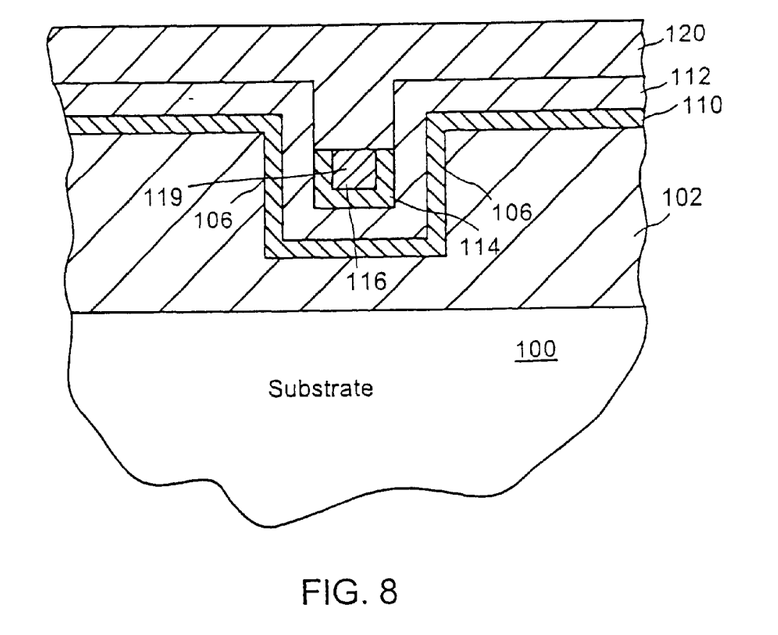
FIG. 8 illustrates the deposition of a gap fill oxide in accordance with one embodiment of the present invention.

FIG. 8 illustrates a gap fill oxide 120 in accordance with one embodiment of the present invention. The gap fill oxide 120 is preferably deposited using a high density plasma chemical vapor deposition (HDP CVD) process over the center conductor 119 and the conformal oxide layer 112, thus filling the trench 106. After deposition is complete, the gap fill oxide 120 is planarized as shown in FIG. 9 to form an oxide layer over the center conductor 119.

Figure 9:
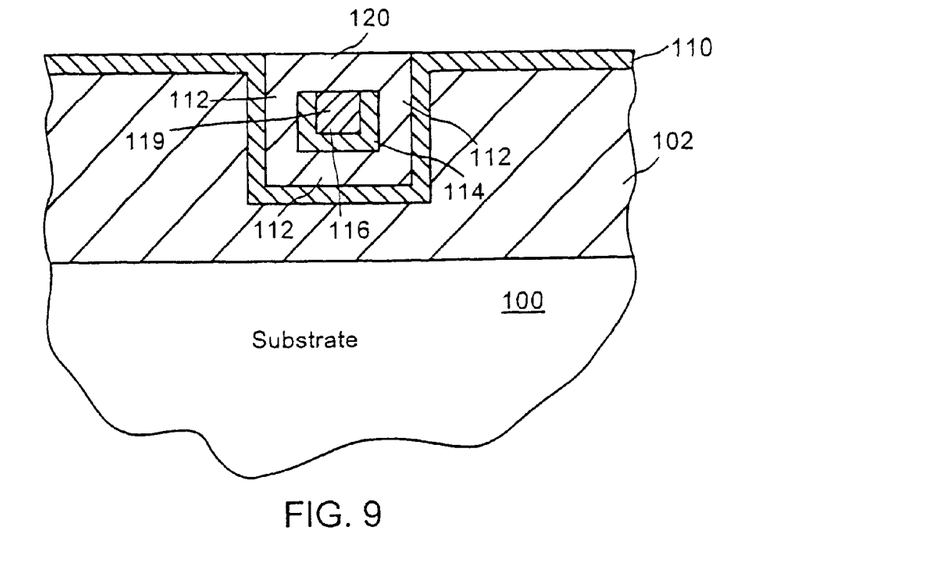
FIG. 9 illustrates the gap fill oxide and the resultant oxide surrounding the center conductor in accordance with one embodiment of the present invention.

FIG. 9 illustrates the gap fill oxide 120 and the resultant oxide 112 surrounding the center conductor 119 after a planarization operation is complete. Preferably, a CMP operation is performed which removes gap fill oxide 120 down to the shield metallization layer 110. Once the CMP operation is complete, a top surface of the gap fill oxide 120 is planar with a top surface of the shield metallization layer 110.

Figure 10:
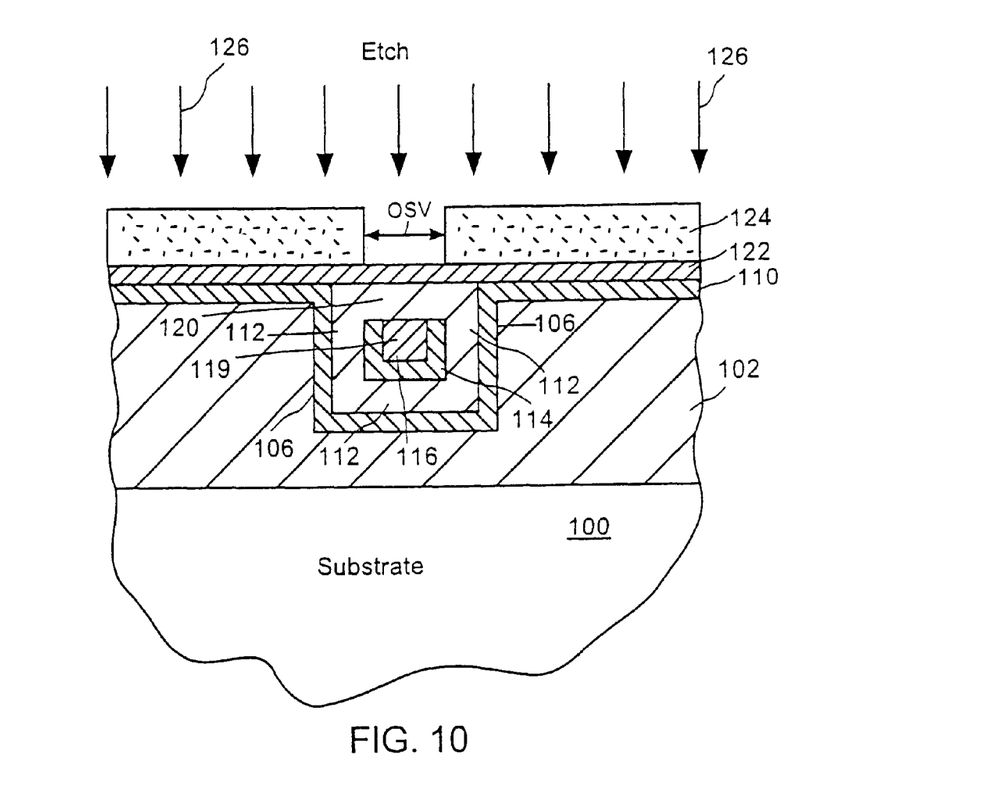
FIG. 10 shows a cap metallization layer formed over the shield metallization layer and the gap fill oxide in accordance with one embodiment of the present invention.

FIG. 10 shows a cap metallization layer 122 formed over the shield metallization layer 110 and the gap fill oxide 120 in accordance with one embodiment of the present invention. The cap metallization layer 122 is deposited over the shield metallization layer 110 such that the cap metallization layer 122 is in electrical contact with the shield metallization layer 110. Also, the cap metallization layer 122 is deposited over portions of the conformal oxide layer 120, and the gap fill oxide 120. The cap metallization layer 122 is preferably titanium nitride. Nonetheless, other suitable conductive materials, such as titanium tungsten (TiW), tungsten (W) and tantalum (Ta) can also be used for the cap metallization layer 122. In this embodiment, the shield metallization layer 122 is configured to complete the enclosure (e.g., the shield metallization layer 110 and cap metallization layer 122) that defines the co-axial line, which is well suited to handle high frequency signals. As mentioned above, such signals can include RF signals, and microwave signals.

Still referring to FIG. 10, the formation of an oversize via (OSV) in the cap metallization layer 122 is shown. In this embodiment, a photoresist mask 124 is formed onto the cap metallization layer 122 using standard photoresist patterning and metal etching 126. The metal etching operation 126 should be configured to substantially remove the cap metallization layer 122 down to the gap fill oxide 120.

Figure 11A:
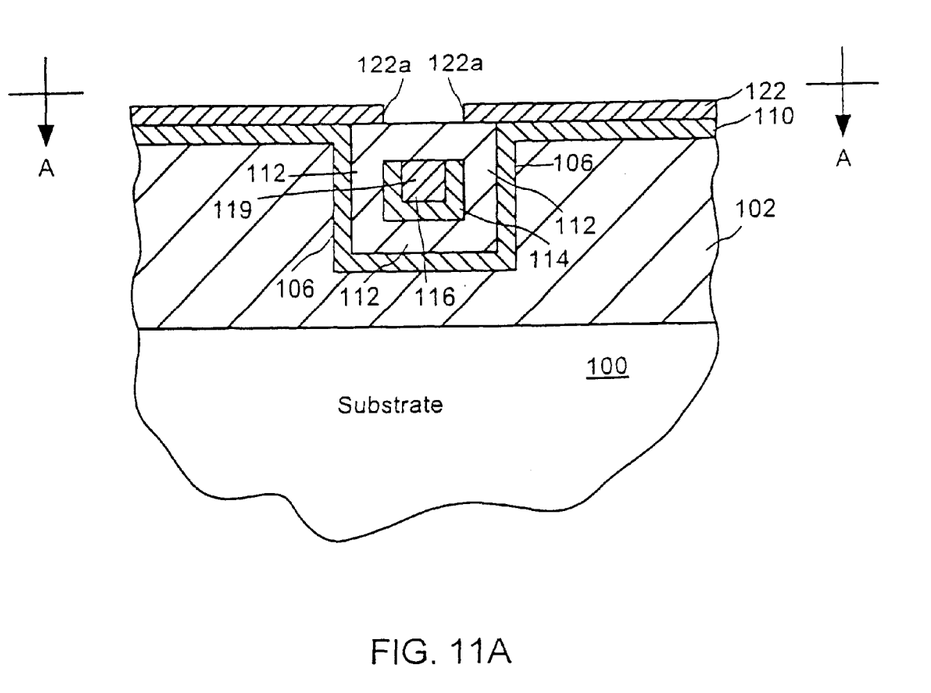
FIG. 11A shows the formation of an oversize via in the cap metallization layer.

FIG. 11A shows the formation of an oversize via 122a in the cap metallization layer 122. The oversize via 122a is defined within the cap metallization layer 122 such that the oversize via 122a is located over the center conductor 119. The oversize via 122a will allow the formation a center conductor via, as will be shown in FIG. 13. The center conductor via will define an electrical contact between the center conductor 119 and CMOS circuitry located throughout the semiconductor device. FIG. 11A defines a cross-section A—A which will now be further described with reference to FIG. 11B.

Figure 11B:
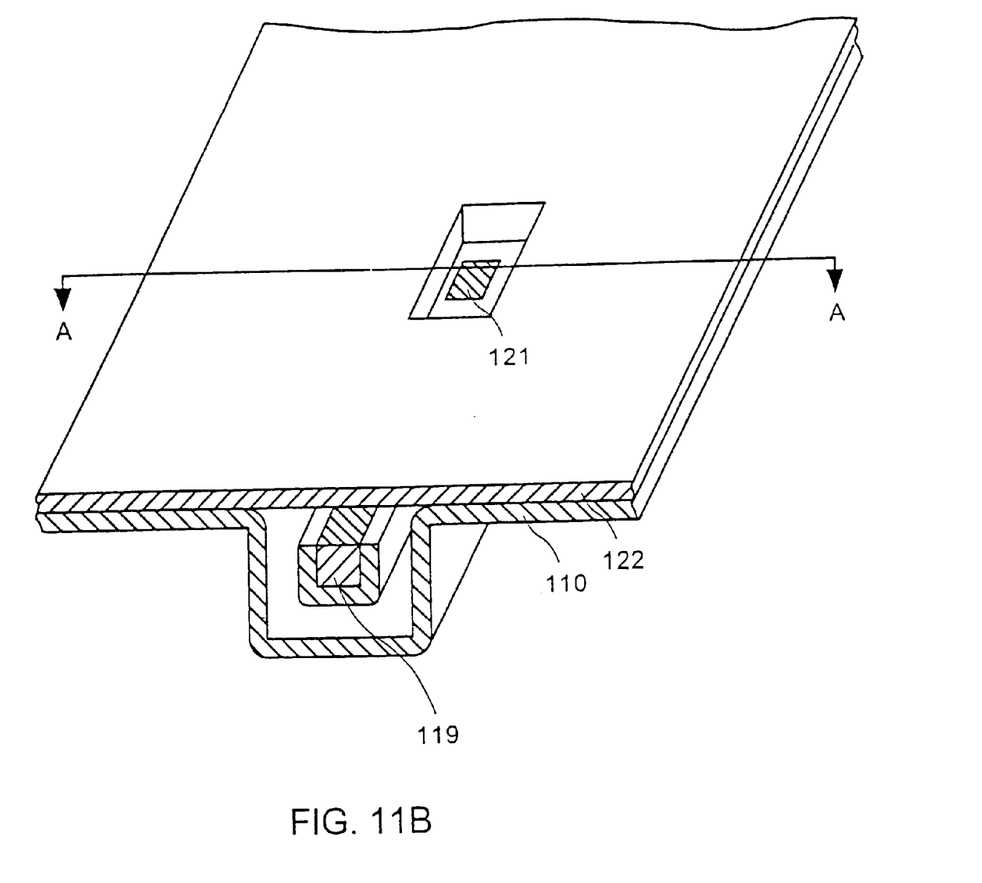
FIG. 11B depicts a simplified three-dimensional view of a co-axial line defined in a dielectric in accordance with one embodiment of the present invention.

FIG. 11B depicts a simplified three-dimensional view of a co-axial line defined in a dielectric in accordance with one embodiment of the present invention. The co-axial line is defined by an outer shield and the center conductor 119. The outer shield is partially defined by the cap metallization layer 122 and the shield metallization layer 110. FIG. 11B shows a via 121 defining a path to the center conductor 119. In general, the via may be located anywhere along the co-axial line in order to integrate the center conductor 119 and the co-axial line with various CMOS lines located throughout a semiconductor device.

Figure 12:
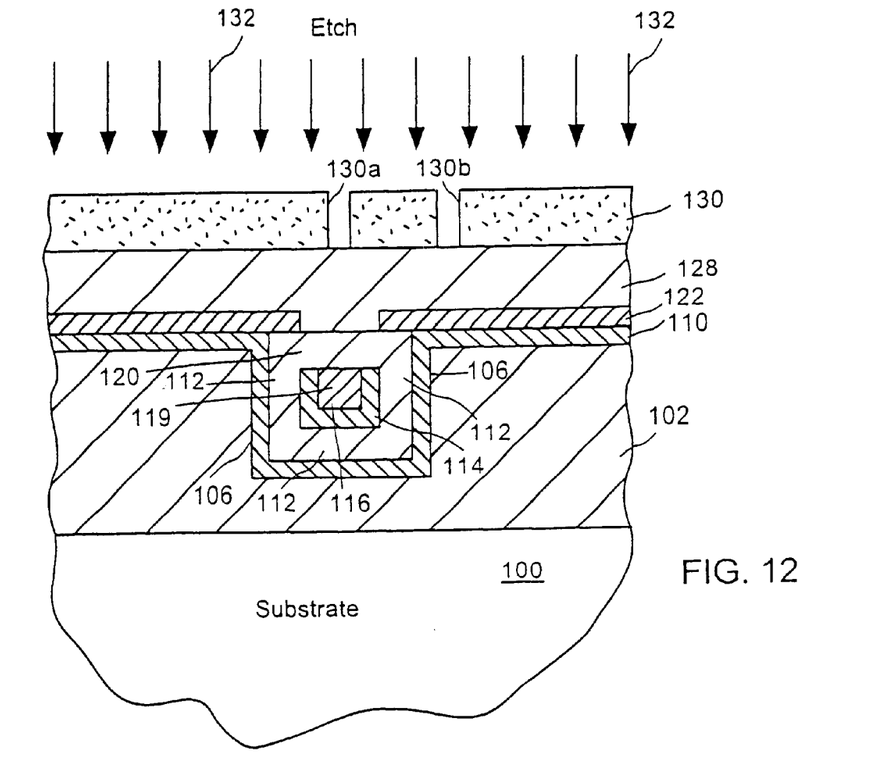
FIG. 12 shows the formation of vias to the center conductor and the cap metallization layer through an inter-metal oxide.

FIG. 12 shows the formation of vias to the center conductor 119 and the cap metallization layer 122 through inter-metal oxide 128. The inter-metal oxide layer 128 is deposited over cap metallization layer 122 and gap fill oxide 120 using standard deposition techniques. Once the deposition is complete, the inter-metal oxide layer 128 is then planarized to allow the spin coating of photoresist. In this example, the photoresist is patterned to define a photoresist mask 130 having a center conductor window 130a and an outer conductor window 130b. A dielectric etch operation 132 is then performed which etches away portions of inter-metal oxide 128 and gap fill oxide 120 as shown in FIG. 13.

Figure 13:
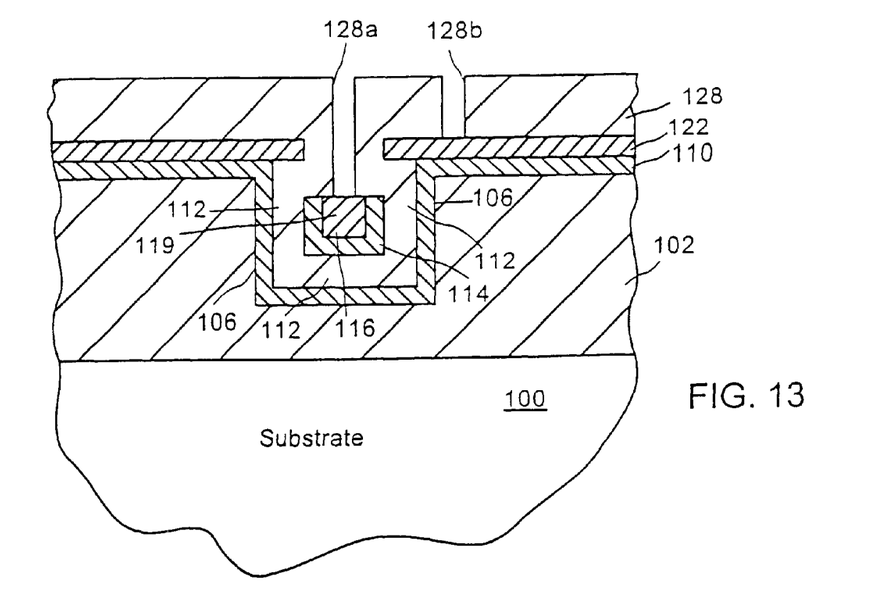
FIG. 13 illustrates the formation of a center conductor via and an outer conductor via in accordance with an embodiment of the present invention.

FIG. 13 illustrates the center conductor via 128a and outer conductor via 128b in accordance with an embodiment of the present invention. The dielectric etch operation 132, as described above, formed the vias 128a and 128b through the inter-metal oxide layer 128. Upon the formation of vias 128a and 128b, tungsten is deposited in vias 128a and 128b as shown in FIG. 14.

Figure 14:
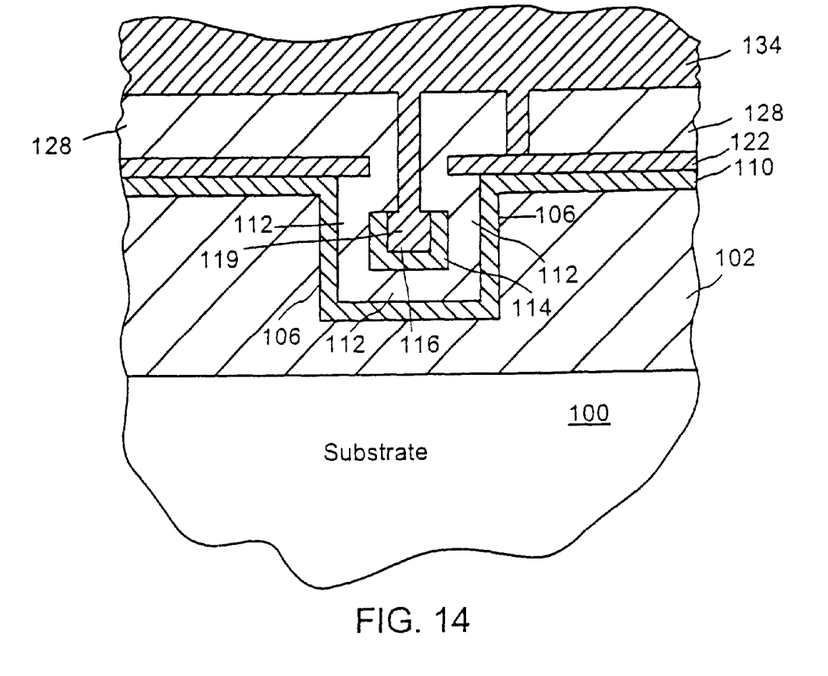
FIG. 14 illustrates the deposition of tungsten in the center conductor via and the outer conductor via.

FIG. 14 illustrates the deposition of tungsten over the inter-metal oxide 128 and in the vias 128a and 128b. After etch operation 132 is completed, a tungsten fill layer 134 is deposited such that the vias 128a and 128b are adequately filled. Upon completion of the tungsten deposition, a tungsten etch back operation is performed to remove the tungsten fill layer 134 down to the inter-metal oxide layer 128. The tungsten fill layer 134 allows electrical contact for the center conductor 119 and the cap metallization layer 122. These electrical connections therefore enable integration of high frequency devices to other CMOS circuitry located throughout the semiconductor device.

Figure 15:
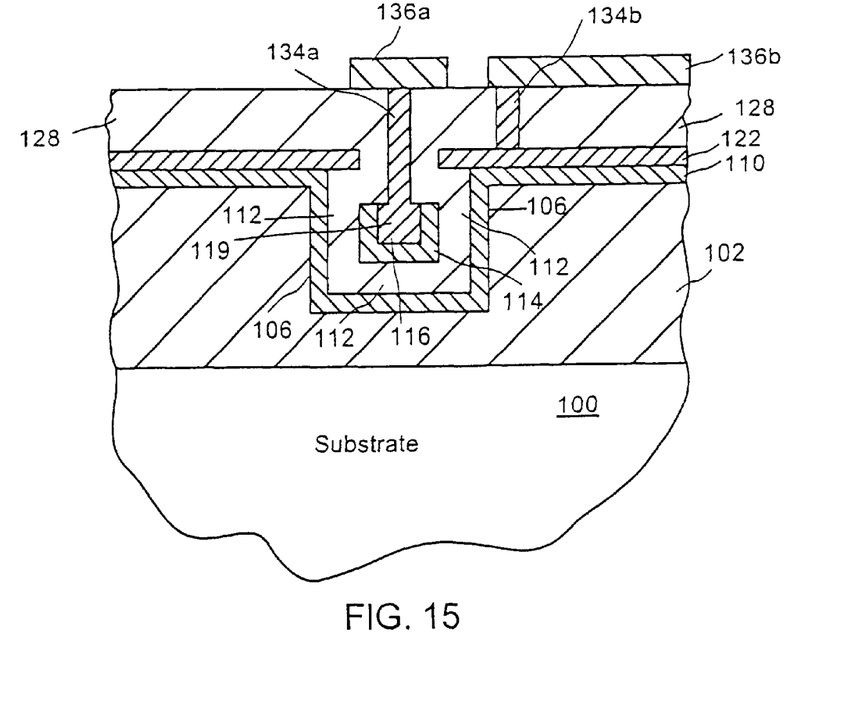
FIG. 15 shows a semiconductor device with a co-axial interconnect line in a CMOS chip in accordance with one embodiment of the present invention.

FIG. 15 shows a partial view of a cross-section of a semiconductor device with a co-axial interconnect line. As mentioned above, the co-axial interconnect line is capable of being integrated into a chip that can process digital CMOS operations as well as high speed applications. A CMOS metallization line 136b is in electrical contact with cap metallization layer 122 through outer conductor via 134b as shown. Another CMOS metallization line 136a is in electrical contact with the center conductor 119 through center conductor conductive via 134a. The center conductor 119 acts as an inner conductor for the co-axial line and cap metallization layer 122 serves as part of the outer shield for the same co-axial line. The co-axial line is capable of handling RF signals, microwave signals and other high speed signal applications. As shown in this particular embodiment, it is now possible to integrate co-axial lines capable of handling high speed applications such as RF signals and microwave signals with CMOS lines in a semiconductor device.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of forming a co-axial interconnect line in a dielectric layer, comprising:

forming a trench in the dielectric layer;

forming a shield metallization layer within the trench;

forming a conformal oxide layer within the shield metallization layer;

forming a center conductor on the conformal oxide layer;

forming a fill oxide layer over the center conductor; and forming a cap metallization layer over the fill oxide layer and in contact with the shield metallization layer.

2. A method of forming a co-axial interconnect line in a dielectric layer according to claim 1, wherein the operation of forming the shield metallization layer includes:

depositing a titanium nitride layer.

3. A method of forming a co-axial interconnect line in a dielectric layer according to claim 1, wherein the operation of forming the center conductor further includes:

depositing a liner titanium nitride layer over the conformal oxide layer;

depositing a tungsten layer over the liner titanium nitride layer; and performing a plasma etchback over the tungsten layer and the liner titanium nitride layer.

4. A method of forming a co-axial interconnect line in a dielectric layer according to claim 1, wherein the operation of forming a cap metallization layer further includes:

planarizing the fill oxide layer down to the shield metallization layer; and depositing a titanium nitride layer over the planarized fill oxide layer such that the cap metallization layer is in electrical contact with the shield metallization layer.

5. A method of forming a co-axial interconnect line in a dielectric layer according to claim 1, further comprising:

forming an oversized via in the cap metallization layer over the center conductor.

6. A method of forming a co-axial interconnect line in a dielectric layer according to claim 1, further comprising:

depositing an inter-metal oxide layer over the cap metallization layer; and patterning the inter-metal oxide layer such that a center conductor via is formed to the center conductor and a outer conductor via is formed to the cap metallization layer.

7. A method for making a semiconductor device with co-axial interconnect lines in a CMOS chip for high speed applications, comprising:

forming a trench in a base dielectric layer;

forming a shield metallization layer over the base dielectric layer and the trench;

forming a conformal oxide layer over the shield metallization layer, the conformal oxide layer defining a region within the trench;

forming a liner metallization layer over the conformal oxide layer and over the region within the trench;

forming a conductive layer over the liner metallization layer to fill the region within the trench;

etching the conductive layer and the liner layer to define a center conductor within the region that is defined within the trench;

forming an oxide layer over the center conductor that is defined by the liner layer and the conductive layer, the oxide layer being configured to fill the region within the trench;

planarizing the oxide layer and the conformal oxide layer down to the shield metallization layer; and forming a cap metallization layer over the shield metallization layer, the conformal oxide layer, and the oxide layer defined within the trench such that the cap metallization layer is in electrical contact with the shield metallization layer.

8. A method for making a semiconductor device with co-axial interconnect lines in a CMOS chip for high speed applications according to claim 7, further comprising:

planarizing a top surface of the base dielectric layer.

9. A method for making a semiconductor device with co-axial interconnect lines in a CMOS chip for high speed applications according to claim 7, wherein the operation of forming the trench within the base dielectric layer further includes:

etching the base dielectric layer to have a depth ranging between about 5,000 Angstroms and about 10,000 Angstroms, and to have a width ranging between about 0.5 micron and about 100 microns.

10. A method for making a semiconductor device with co-axial interconnect lines in a CMOS chip for high speed applications according to claim 7, wherein the operation of forming the shield metallization layer includes:

depositing a layer of titanium nitride having a thickness ranging between about 100 Angstroms and about 1,000 Angstroms.

11. A method for making a semiconductor device with co-axial interconnect lines in a CMOS chip for high speed applications according to claim 7, wherein the operation of forming the conformal oxide layer includes:

depositing a plasma enhanced chemical vapor deposition (PECVD) oxide layer.

12. A method for making a semiconductor device with co-axial interconnect lines in a CMOS chip for high speed applications according to claim 7, wherein the operation of forming the liner metallization layer includes:

depositing a titanium nitride layer having a thickness ranging between about 100 Angstroms and about 500 Angstroms.

13. A method for making a semiconductor device with co-axial interconnect lines in a CMOS chip for high speed applications according to claim 7, wherein the operation of forming the conductive layer includes:

depositing a tungsten layer to a deposited thickness ranging between about 3,000 Angstroms and about 10,000 Angstroms.

14. A method for making a semiconductor device with co-axial interconnect lines in a CMOS chip for high speed applications according to claim 7, wherein the operation of forming the cap metallization layer includes:

depositing a titanium nitride layer having a thickness ranging between about 100 Angstroms and about 1,000 Angstroms.

15. A method for making a semiconductor device with co-axial interconnect lines in a CMOS chip for high speed applications according to claim 7, further comprising:

forming an oversized via opening over the cap metallization layer such that the oversized via opening is defined substantially over the inner conductor.

16. A method for making a semiconductor device with co-axial interconnect lines in a CMOS chip for high speed applications according to claim 15, further comprising:

forming an inter-metal oxide layer over the cap metallization layer and within the oversized via opening.

17. A method for making a semiconductor device with co-axial interconnect lines in a CMOS chip for high speed applications according to claim 16, further comprising:

etching a center conductor via hole through the inter-metal oxide layer and the oxide layer that is defined over the inner conductor.

18. A method for making a semiconductor device with co-axial interconnect lines in a CMOS chip for high speed applications according to claim 16, further comprising:

etching an outer conductor via hole through the inter-metal oxide layer down to the cap metallization layer, the cap metallization layer being in electrical contact with the shield metallization layer.

* * * * *